US011239395B2

(12) United States Patent
Maegawa et al.

(10) Patent No.: US 11,239,395 B2
(45) Date of Patent: Feb. 1, 2022

(54) IMAGE DISPLAY DEVICE

(71) Applicant: SHARP KABUSHIKI KAISHA, Sakai (JP)

(72) Inventors: Masumi Maegawa, Sakai (JP); Hitoshi Aoki, Sakai (JP); Toshiya Ishio, Sakai (JP); Katsuji Iguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 86 days.

(21) Appl. No.: 16/810,159

(22) Filed: Mar. 5, 2020

(65) Prior Publication Data
US 2020/0287103 A1 Sep. 10, 2020

Related U.S. Application Data

(60) Provisional application No. 62/815,897, filed on Mar. 8, 2019.

(51) Int. Cl.
H01L 33/00 (2010.01)
H01L 21/00 (2006.01)
H01L 33/50 (2010.01)
H01L 25/075 (2006.01)
H01L 33/52 (2010.01)

(52) U.S. Cl.
CPC ........ H01L 33/504 (2013.01); H01L 25/0753 (2013.01); H01L 33/507 (2013.01); H01L 33/508 (2013.01); H01L 33/52 (2013.01)

(58) Field of Classification Search
CPC .............................................. H01L 33/50–508

USPC ........................................ 438/29, 69; 257/98
See application file for complete search history.

(56) References Cited

U.S. PATENT DOCUMENTS

| 8,210,890 B2* | 7/2012 | Chae .................. H01L 27/3253 445/25 |
| 10,748,879 B2* | 8/2020 | Iguchi ................. H01L 25/0753 |
| 10,784,308 B2* | 9/2020 | Kim .................... H01L 27/1222 |
| 2011/0121731 A1 | 5/2011 | Tsutsumi et al. |
| 2012/0087107 A1 | 4/2012 | Kunimasa et al. |
| 2019/0187514 A1 | 6/2019 | Kuniyasu et al. |

FOREIGN PATENT DOCUMENTS

| JP | 2002-141492 A | 5/2002 |
| JP | 2010-040976 A | 2/2010 |
| JP | 2011108589 A | 6/2011 |
| JP | 2013-213932 A | 10/2013 |
| JP | 2013-235141 A | 11/2013 |
| JP | 2014016408 A | 1/2014 |
| JP | 2018-010041 A | 1/2018 |
| WO | 2010/143461 A1 | 12/2010 |

* cited by examiner

Primary Examiner — Calvin Lee
(74) Attorney, Agent, or Firm — ScienBiziP, P.C.

(57) ABSTRACT

An image display device includes: a plurality of LED elements that are mounted on a drive circuit substrate and emit light source light; a wavelength conversion layer that is stacked on a side of the LED elements opposite to the drive circuit substrate, converts the light source light emitted by the LED elements into long wavelength light, and emits the long wavelength light to a side opposite to the drive circuit substrate; and a first functional layer that is disposed on a light emitting surface side of the long wavelength light of the wavelength conversion layer, reflects the light source light, and transmits the long wavelength light.

11 Claims, 13 Drawing Sheets

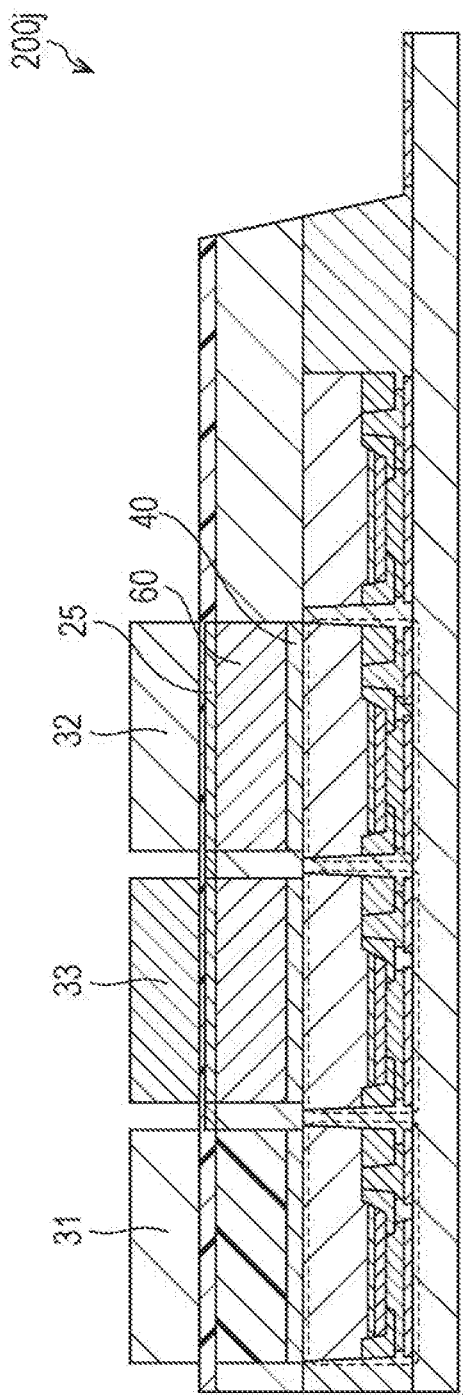

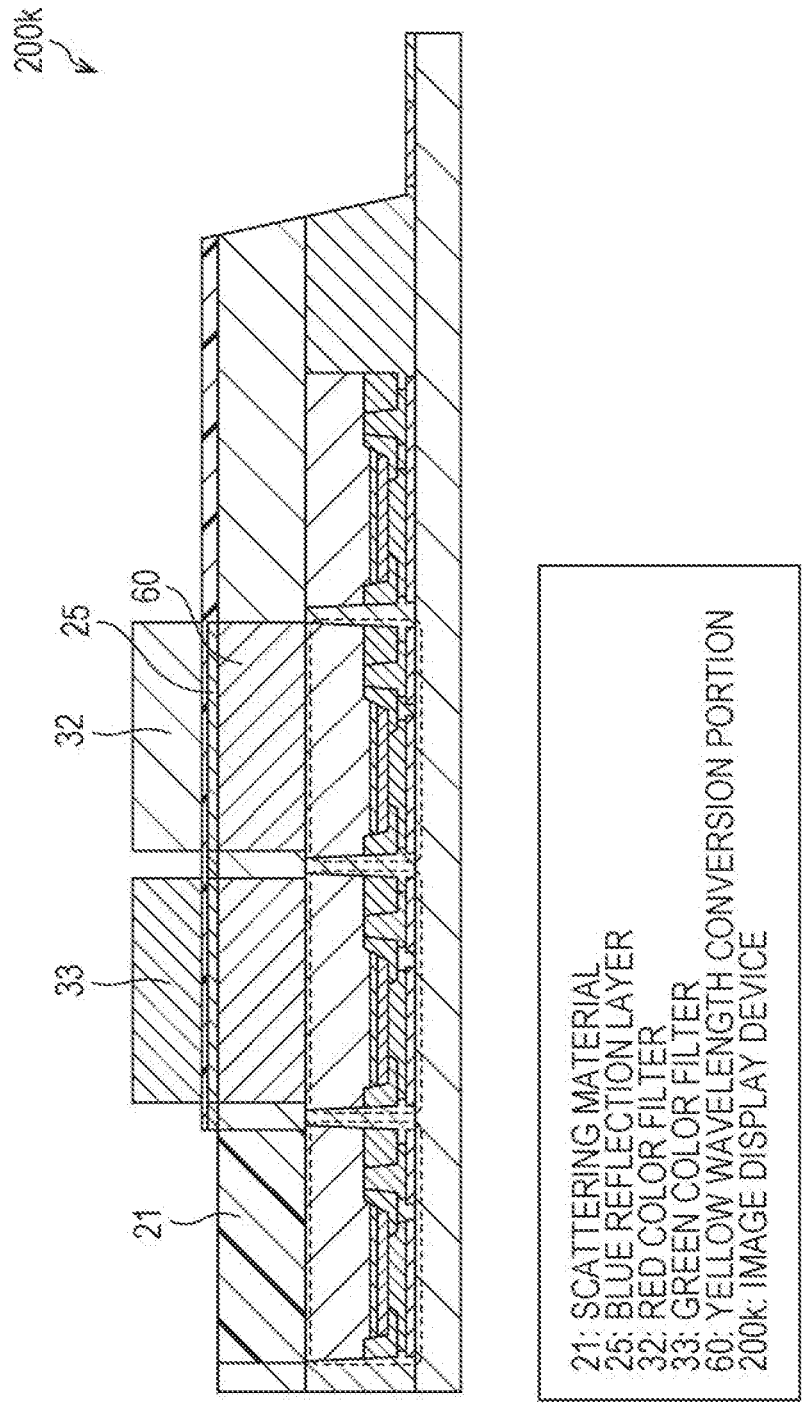

IMAGE DISPLAY DEVICE

CROSS-REFERENCE TO RELATED APPLICATION

The present application claims priority to U.S. Provisional Application Ser. No. 62/815,897, filed Mar. 8, 2019, the content to which is hereby incorporated by reference into this application.

BACKGROUND OF THE INVENTION

1. Field of the Invention

The present invention relates to an image display device.

2. Description of the Related Art

In the related art, an image display device including a plurality of micro LED elements that are minute LED elements is known. In such an image display device, a device that displays a color image by forming a drive circuit on a silicon substrate, arranging a minute ultraviolet light emitting diode (LED) array on a surface of the substrate, and disposing a wavelength conversion layer converting ultraviolet light into visible light of red, green, and blue is suggested (for example, see Japanese Unexamined Patent Application Publication No. 2002-141492).

The image display device as described in Japanese Unexamined Patent Application Publication No. 2002-141492 has characteristics of high brightness and high durability while the display device is small in size, and is expected to be used for a glasses-type terminal for augmented reality (AR) or a display device for a head-up display (HUD).

In addition, in such an image display device, a liquid crystal display device having a structure in which a band-pass filter that is arranged on a light source side and transmits blue light as light source light, a phosphor that performs wavelength conversion, and a color filter are stacked is known (for example, see WO 2010/143461 A1). WO 2010/143461 A1 discloses a liquid crystal display device having a structure in which a gap between pixels is filled with a black matrix at phosphor portions and color filter portions, and the black matrix includes a reflective body covering a side wall and an absorbing body. A target of this technology is a direct-view type, relatively large display device.

Further, a band-pass filter that reflects light source light and transmits light after conversion may be formed on a light emitting surface of a wavelength conversion layer to prevent leakage of the light source light (for example, see Japanese Unexamined Patent Application Publication No. 2013-213932).

SUMMARY OF THE INVENTION

In a projection-type small image display device used for a glasses-type terminal for AR or the like, it is necessary to reduce the pixel size to about several micrometers in order to increase definition of a display image. On the other hand, in order to cause the wavelength conversion layer to absorb light source light serving as excitation light and sufficiently perform wavelength conversion, a desired thickness of the wavelength conversion layer is from several micrometer to more than 10 μm. Therefore, an aspect ratio (ratio of height/width) of the wavelength conversion layer increases (for example, 2 or more), and patterning of the wavelength conversion layer becomes extremely difficult.

In order to facilitate patterning of the wavelength conversion layer, a thickness of the wavelength conversion layer has to be reduced. For this purpose, it is necessary to arrange a layer that transmits excitation light and reflects long wavelength light whose wavelength is converted (hereinafter, referred to as a reflection layer) on an incident side of the excitation light of the wavelength conversion layer, and arrange a layer that reflects the excitation light and transmits the long wavelength light whose wavelength is converted (hereinafter, referred to as a transmission layer) on an emission side of the wavelength conversion layer. With this configuration, it is possible to improve conversion efficiency by efficiently emitting the long wavelength light whose wavelength is converted and confining the excitation light in the wavelength conversion layer.

However, as a micro LED serving as a light source becomes minute, influence of crosstalk in which the above-described reflection layer and the transmission layer serve as a light guide path increases. Therefore, image quality deteriorates when the reflection layer and the transmission layer are entirely formed.

In addition, with reduction of a small image display device in size, each component is also reduced in size, and thus heat generated from a micro LED as a light source tends to be trapped in the display device. In particular, since a distance between a color conversion material and the micro LED is short, color conversion efficiency may decrease due to an increase in temperature of the color conversion material.

An aspect of the present invention has been made in view of the above-described circumstances, and an object of the present invention is to provide a technology for suppressing a reduction in color conversion efficiency.

(1) According to an embodiment of the present invention, an image display device includes a plurality of LED elements that are mounted on a drive circuit substrate and emit light source light, a wavelength conversion layer that is stacked on a side of the LED elements opposite to the drive circuit substrate, converts the light source light emitted by the LED elements into long wavelength light, and emits the long wavelength light to a side opposite to the drive circuit substrate, and a first functional layer that is disposed on a light emitting surface side of the long wavelength light of the wavelength conversion layer, reflects the light source light, and transmits the long wavelength light.

(2) According to the embodiment of the present invention, in the image display device, the first functional layer is partitioned for each of the plurality of LED elements, in addition to the configuration of (1).

(3) According to the embodiment of the present invention, the image display device further includes a second functional layer that is disposed on a light incident surface side of the light source light of the wavelength conversion layer and reflects the long wavelength light, in addition to the configuration of (1) or (2).

(4) According to the embodiment of the present invention, in the image display device, the second functional layer is partitioned for each of the plurality of LED elements, in addition to the configuration of (3).

(5) According to the embodiment of the present invention, in the image display device, a light emitting surface of the first functional layer is covered with a first film having moisture resistance, in addition to the configuration of (1), (2), (3), or (4).

(6) According to the embodiment of the present invention, in the image display device, a light emitting surface of the second functional layer is covered with a second film having moisture resistance, in addition to the configuration of (3) or (4).

(7) According to the embodiment of the present invention, in the image display device, a gap between the first functional layers partitioned for each of the plurality of LED elements is filled with a first filling material different from a material of the first functional layer, in addition to the configuration of (2).

(8) According to the embodiment of the present invention, in the image display device, a gap between the second functional layers partitioned for each of the plurality of LED elements is filled with a second filling material different from a material of the second functional layer, in addition to the configuration of (3).

(9) According to the embodiment of the present invention, in the image display device, the first functional layer is made of a dielectric, in addition to the configuration of (1), (2), (3), (4), (5), (6), (7), or (8).

(10) According to the embodiment of the present invention, in the image display device, the second functional layer is made of a dielectric, in addition to the configuration of (3), (4), or (8).

(11) According to the embodiment of the present invention, in the image display device, the wavelength conversion layer is partitioned for each of the plurality of LED elements and the partitioned wavelength conversion layers have different thicknesses, in addition to the configuration of (1), (2), (3), (4), (5), (6), (7), (8), (9), or (10).

According to one aspect of the present invention, a technology can be improved for improving color conversion efficiency and realizing high brightness and a high color gamut.

BRIEF DESCRIPTION OF THE DRAWINGS

FIG. 12 is a sectional view of an image display device according to Embodiment 11 of the present invention.

FIG. 13 is a sectional view showing a modification example of the image display device according to Embodiment 11 of the present invention.

DETAILED DESCRIPTION OF THE INVENTION

Embodiment 1

Figure 1:
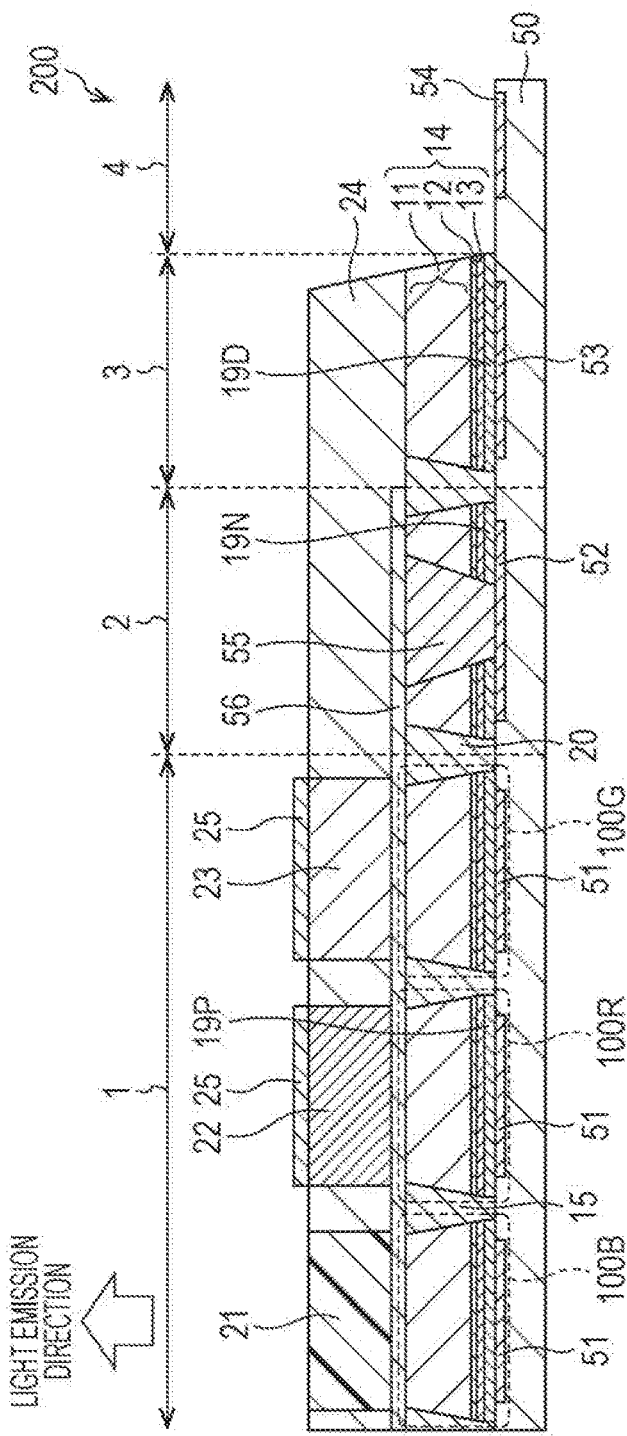
FIG. 1 is a sectional view of an image display device according to Embodiment 1 of the present invention.
Figure 2:
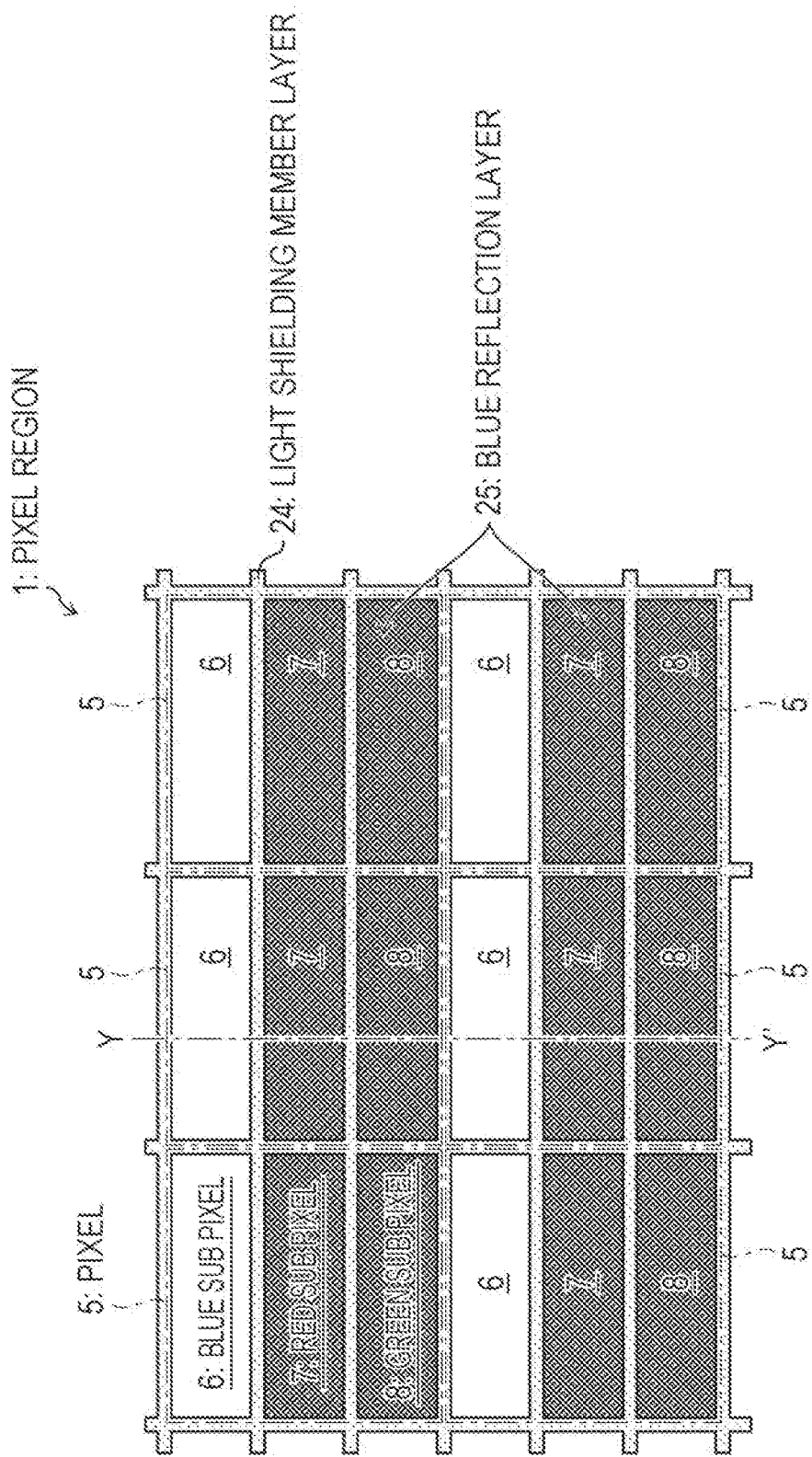
FIG. 2 is a top view of the image display device according to Embodiment 1 of the present invention.

Hereinafter, an image display device 200 according to Embodiment 1 of the present invention will be described in detail. FIG. 1 is a sectional view of the image display device 200 according to Embodiment 1. FIG. 2 is a top view of the image display device 200. The sectional view in FIG. 1 is a sectional view of the image display device 200 along the line Y-Y' shown in FIG. 2.

(Overall Configuration of Image Display Device 200)

As shown in FIG. 1, the image display device 200 includes a plurality of micro LED elements 100 as light sources. The image display device 200 includes a pixel region 1, a common interconnection region 2, a dummy region 3, and a peripheral region 4.

As shown in FIG. 2, pixels 5 are arranged in an array form in the pixel region 1. Each pixel 5 includes a blue sub pixel 6, a red sub pixel 7, and a green sub pixel 8. The blue sub pixel 6, the red sub pixel 7, and the green sub pixel 8 emit blue light, red light, and green light of which intensities can be adjusted, respectively. The image display device 200 is configured to emit light having various colors as the pixel 5 by adjusting the light emission intensities of the blue sub pixel 6, the red sub pixel 7, and the green sub pixel 8, respectively. In FIG. 2, although the sub pixels have a stripe array in a rectangular shape, the shape and the array of the sub pixels are not limited to this, and the array may be a mosaic array with a dot shape, a delta array with triangles, or a Bayer array with squares.

As shown in FIGS. 1 and 2, the blue sub pixel 6 includes a micro LED element 100B that emits light source light, the red sub pixel 7 includes a micro LED element 100R that emits light source light, and the green sub pixel 8 includes a micro LED element 100G that emits light source light. The micro LED elements 100B, 100R, and 100G have the same structure as each other and emit blue light. In the following description, in a case where the micro LED elements 100B, 100R, and 100G are referred to as a whole, the micro LED elements 100B, 100R, and 100G will be denoted by a micro LED element 100.

Each of the micro LED elements 100B, 100R, and 100G includes a nitride semiconductor layer 14, a P-electrode 19P (first electrode), and a common N-electrode 56 (second electrode), and is mounted on a drive circuit substrate 50. The common N-electrode 56 is arranged on a light emitting surface side of each of the micro LED elements 100B, 100R, and 100G. The P-electrode 19P is arranged on a drive circuit substrate 50 side of each of the micro LED elements 100B, 100R, and 100G.

The P-electrode 19P is connected to a P-drive electrode 51 mounted in the drive circuit substrate 50. The common N-electrode 56 is connected to an N-drive electrode 52 mounted in the drive circuit substrate 50 through a plug 55 in the common interconnection region 2.

The micro LED element 100 emits light by being supplied with a current from the corresponding P-drive electrode 51. A light emission direction of the micro LED element 100 is a direction opposite to the drive circuit substrate 50 and is on the common N-electrode 56 side.

The micro LED elements 100B, 100R, and 100G are individually divided by a pixel isolation trench 15. The pixel isolation trench 15 is filled with a filling material 20.

The dummy region 3 is a region of the image display device 200 other than the pixel region 1, the common interconnection region 2, and the peripheral region 4. While the nitride semiconductor layer 14 is arranged in the dummy region 3, the nitride semiconductor layer 14 does not emit light and is a region arranged in order to secure surface planarity of the image display device 200.

In the dummy region 3, for example, an alignment mark required for forming the micro LED element 100, an alignment mark required for mounting the micro LED element 100 on the drive circuit substrate 50, or an auxiliary structure required for manufacturing the image display device 200 may be included. A drive circuit of each pixel is arranged in the pixel region 1 and the common interconnection region 2 of the drive circuit substrate 50. In the drive circuit substrate 50, circuits such as a row selection circuit, a column signal output circuit, an image processing circuit, and an input-output circuit are mainly arranged in the dummy region 3. Further, a dummy-drive electrode 19D disposed on the drive circuit substrate 50 is arranged in order to fix the nitride semiconductor layer 14 to the drive circuit substrate 50 and shield circuits such as a row selection circuit, a column signal output circuit, an image processing circuit, and an input-output circuit.

The peripheral region 4 defines the periphery of the image display device 200 and includes a scribe region for cutting the image display device 200 into dice and an I/O-electrode 54 serving as a portion connected with an external circuit such as a wire bond pad. In the peripheral region 4, the nitride semiconductor layer 14 is removed.

(Configuration of Pixel 5)

The blue sub pixel 6 has, on the common N-electrode 56, a scattering material 21 formed of a transparent resin pattern containing scattering particles. The blue sub pixel 6 discharges blue light emitted by the micro LED element 100B to the outside as it is without performing wavelength conversion by broadening the emission direction by the scattering particles of the scattering material 21.

The red sub pixel 7 has a red conversion portion (wavelength conversion layer) 22 stacked on a side of the micro LED element 100R opposite to the drive circuit substrate 50. The red conversion portion 22 includes a material that performs wavelength conversion from blue light source light emitted by the micro LED element 100R into red light which is light having a longer wavelength than blue light. The red sub pixel 7 causes the red conversion portion 22 to perform wavelength conversion from blue light emitted by the micro LED element 100R into red light, and emits red light to the outside in the light emission direction opposite to the direction of the drive circuit substrate 50.

The green sub pixel 8 has a green conversion portion (wavelength conversion layer) 23 stacked on a side of the micro LED element 100G opposite to the drive circuit substrate 50. The green conversion portion 23 includes a material that performs wavelength conversion from blue light source light emitted by the micro LED element 100G into green light which is light having a longer wavelength than blue light. The green sub pixel 8 causes the green conversion portion 23 to perform wavelength conversion from blue light emitted by the micro LED element 100G into green light, and emits green light to the outside in the light emission direction opposite to the direction of the drive circuit substrate 50.

Materials of the red conversion portion 22 and the green conversion portion 23 are not limited, but in order to perform more minute processing, it is desirable to use a material in which a resin material is used as a base material and a phosphor or quantum dots (QD) as a wavelength conversion material are dispersed therein.

In forming the scattering material 21, the red conversion portion 22, and the green conversion portion 23 on each micro LED element, while FIG. 1 shows a state in which the scattering material 21, the red conversion portion 22, and the green conversion portion 23 are formed directly, the micro LED element surface may be modified with a material serving as an adhesive layer in order to improve adhesiveness of each material. In this case, it is preferable that the material has high transmittance of light emitted from the micro LED element. In addition, it is desirable to make this adhesive layer as thin as possible so that it does not serve as a light guide, for example, less than 1 µm is more preferable.

Gaps among the pixels 5 and gaps among the sub pixels 6, 7, and 8 are filled with, for example, a light-shielding resin material to form a light shielding member layer 24. Light emitted from the adjacent micro LED element 100 in an oblique direction is shielded by the light shielding member layer 24 in the gaps among the pixels 5 and the gaps among the sub pixels 6, 7, and 8. Therefore, it is possible to suppress light from the adjacent micro LED element 100 from being incident on the red conversion portion 22 or the green conversion portion 23. A material used for the light shielding member layer 24 may be any material that exhibits a function of shielding light from the adjacent micro LED element 100, for example, may be a colored resin containing a pigment, a resin containing light-absorbing minute particles, a metal that reflects light, or a metal film having high light reflectivity formed on a resin surface.

Each of the micro LED elements 100B, 100R, and 100G includes the nitride semiconductor layer 14. The nitride semiconductor layer 14 includes an N-side layer 11, a light-emission layer 12, and a P-side layer 13 in order from the light emitting surface side of the micro LED element 100. The whole N-side layer 11 is connected by means of the common N-electrode 56. The common N-electrode 56 is electrically connected to the N-drive electrode 52 included in the drive circuit substrate 50 through the plug 55 in the common interconnection region 2. The P-side layer 13 is connected to the P-drive electrode 51. The common N-electrode 56 is preferably a material that does not attenuate light emitted from the micro LED element 100, for example, ITO.

In the red sub pixel 7 and the green sub pixel 8, a blue reflection layer (first functional layer) 25 is arranged on the light emission side of each of the red conversion portion 22 and the green conversion portion 23. The blue reflection layer 25 has characteristics of reflecting blue light and transmitting light having a longer wavelength than blue light. The blue reflection layer 25 is formed of, for example, a dielectric multilayer film including a titanium oxide thin film and a silicon dioxide thin film.

In the red sub pixel 7, red light generated by the red conversion portion 22 is transmitted through the blue reflection layer 25 and discharged to the outside in the light emission direction. In the red sub pixel 7, blue light is reflected by the blue reflection layer 25, returned to the red conversion portion 22, and thus absorbed again by the red conversion portion 22. Therefore, the amount of blue light emitted from the red conversion portion 22 to the outside in the light emission direction is extremely small.

As described above, by disposing the blue reflection layer 25 on the light emission side of the red conversion portion 22, the emission of blue light from the red sub pixel 7 to the outside can be reduced, and conversion efficiency in the red conversion portion 22 can be increased. It is more preferable that the blue reflection layer 25 is optically separated. By utilizing the effect of disposing the blue reflection layer 25, the red conversion portion 22 can be made thinner.

The green sub pixel 8 also includes the blue reflection layer 25 having the same configuration as the above-described red sub pixel 7. That is, in the red sub pixel 7 and the green sub pixel 8, the blue reflection layer 25 having characteristics of reflecting blue light and transmitting light having a longer wavelength than blue light is disposed on the emission surface side of light whose wavelength is converted, of the red conversion portion 22 and the green conversion portion 23.

In the blue reflection layer 25, it is more preferable that a region corresponding to the micro LED element 100R and a region corresponding to the micro LED element 100G are optically separated. As described above, by configuring the blue reflection layer 25 to be partitioned for each micro LED element 100, so-called crosstalk in which light leaks to the adjacent sub pixels 7 and 8 with the blue reflection layer 25 serving as a light guide path can be prevented. For example, in a case where the size of the pixel 5 is 30 μm or more, influence of crosstalk is not large. On the other hand, in the pixel 5 whose size is minutely reduced to a size smaller than 30 μm, blue light is guided to an adjacent sub pixel, and color reproducibility is reduced. More specifically, in a case where the pixel size is made smaller than 10 μm in order to increase the resolution of the display, for example, the distance between pixels is about 1 μm, and the optical path width is such that influence of crosstalk cannot be ignored on the pixel size. Therefore, it is desirable to remove the blue reflection layer 25 in regions between pixels. In order to divide the blue reflection layer 25 for each region, a method of dividing the blue reflection layer 25 by processing a lift-off resist before forming the blue reflection layer 25, or a method of removing an unnecessary portion by etching after forming the entire film is used. There is no limitation on the method.

As a material for controlling the wavelength of transmitted light, for example, a color filter may be formed on the outermost surface of each of the region corresponding to the micro LED element 100R and the region corresponding to the micro LED element 100G. The color filter also allows the wavelength of the emission light to be more strictly controlled, thereby improving the color gamut of the display.

As described above, according to the configuration of Embodiment 1, color conversion efficiency in each of the sub pixels 7 and 8 can be improved, and brightness and color reproducibility can be improved.

Embodiment 2

Embodiment 2 of the present invention will be described below. For easy description, members having the same functions as the members described in Embodiment 1 are denoted by the same reference numerals, and repetitive descriptions thereof will not be made.

An image display device 200a according to Embodiment 2 is different from the image display device 200 of Embodiment 1 only in that a red or green reflection layer 28 is formed between a color conversion layer and the micro LED element 100, and other configurations are the same as those of the image display device 200 of Embodiment 1.

In the region of each of the micro LED element 100R and the micro LED element 100G, the red or green reflection layer (second functional layer) 28 is formed on the surface of the common N-electrode 56. The red or green reflection layer 28 has, for example, a multilayer structure of a dielectric material. The red or green reflection layer 28 is formed of, for example, a dielectric multilayer film including a titanium oxide thin film and a silicon dioxide thin film.

The red or green reflection layer 28 has characteristics of transmitting blue light and reflecting light having a longer wavelength than blue light. The red or green reflection layer 28 has high reflection properties at least for light in a wavelength range of green light (for example, wavelength of 520 nm±15 nm) and a wavelength range of red light (for example, wavelength of 630 nm±15 nm).

In the red sub pixel 7, red light generated by the red conversion portion 22 is transmitted through the blue reflection layer 25 and discharged to the outside in the light emission direction. In the red sub pixel 7, blue light is reflected by the blue reflection layer 25, returned to the red conversion portion 22, and thus absorbed again by the red conversion portion 22. Blue light that travels to the micro LED 100R side without being absorbed by the red conversion portion 22 is transmitted through the red or green reflection layer 28 and is incident on an interface between the P-electrode 19P and the P-side layer 13. Accordingly, blue light is confined between the blue reflection layer 25 and the interface between the P-electrode 19P and the P-side layer 13. Therefore, the amount of blue light emitted from the red conversion portion 22 to the outside in the light emission direction is extremely small. In addition, while blue light is reflected by the blue reflection layer 25 and passes through the red conversion portion 22 a number of times, wavelength conversion proceeds, and thus conversion efficiency of the red conversion portion 22 increases.

On the other hand, in a case where the red or green reflection layer 28 is not provided, part of red light generated by the red conversion portion 22 is incident on the micro LED element 100R and is reflected at the interface between the P-electrode 19P and the P-side layer 13. However, the reflectance of visible light at an interface between a nitride semiconductor and a metal electrode is generally low, and thus light loss in the red sub pixel 7 increases.

Figure 3:
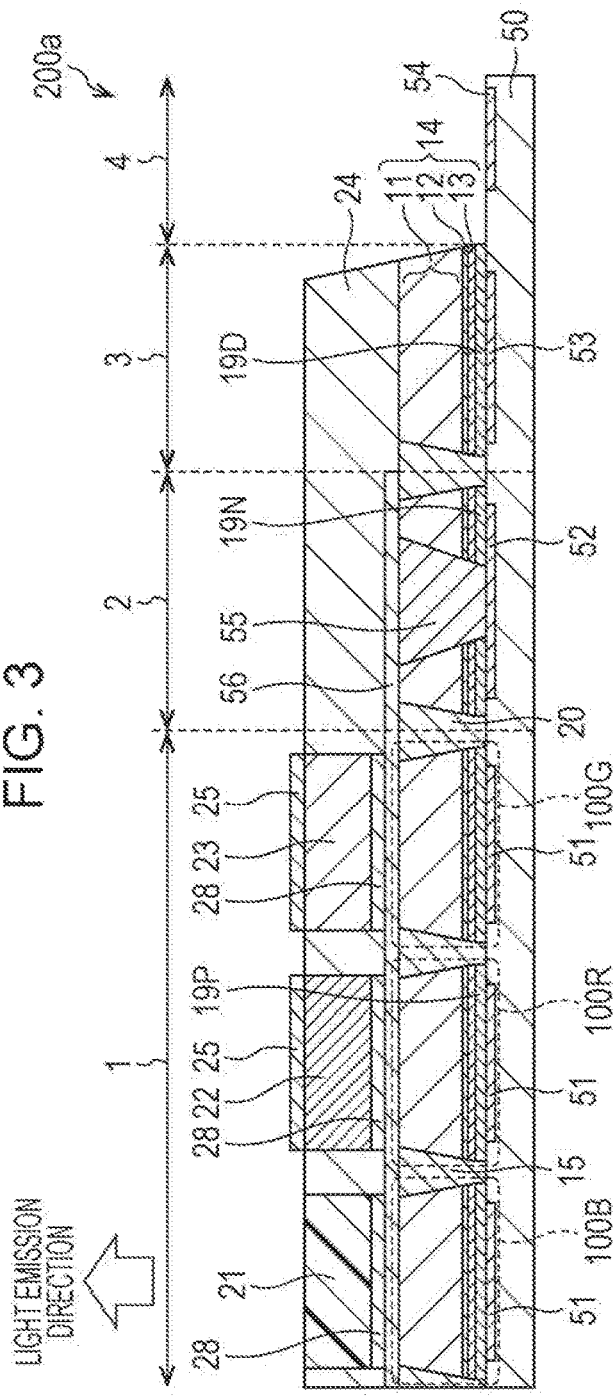
FIG. 3 is a sectional view of an image display device according to Embodiment 2 of the present invention.

For example, in a case where an electrode material of the P-electrode 19P is silver, the reflectance for visible light can be 90% or more, but it is difficult to make an ohmic contact between the P-electrode 19P and the P-side layer 13. Further, silver tends to cause a failure due to migration, and thus it is difficult to apply silver to the structure shown in FIG. 3.

In a case where palladium which easily makes an ohmic contact between the P-electrode 19P and the P-side layer 13 is used as a material of the P-electrode 19P, the reflectance of visible light is only about 50%, and light loss in the red sub pixel 7 increases. A composite layer of Ni/ITO can be used as the P-electrode 19P, but in this case, the reflectance of visible light reflectance is 50% or less.

Accordingly, as described above, it is desirable to increase the reflectance of long wavelength light by using the red or green reflection layer 28 formed of a multilayer film. Thus, extraction efficiency of red light from the red sub pixel 7 can be improved, and light emission efficiency of red light in the image display device 200a can be increased. In general, conversion efficiency of a color conversion member used in the red conversion portion 22 decreases as the temperature increases. Therefore, by sandwiching the red or green reflection layer 28 made of a member having low thermal conductivity between the red conversion portion 22 and the common N-electrode 56 on the micro LED 100R side, the auxiliary effect that decrease in color conversion efficiency of the red conversion portion 22 can be suppressed is also achieved.

The green sub pixel 8 also includes the red or green reflection layer 28 having the same configuration as the above-described red sub pixel 7. That is, in the red sub pixel 7 and the green sub pixel 8, the red or green reflection layer 28 having characteristics of reflecting light having a longer wavelength than blue light is disposed on the light incident surface side from the micro LED element 100, of the red conversion portion 22 and the green conversion portion 23.

The red or green reflection layer 28 does not need to have a high reflectance over the entire range of a wavelength that is longer than that of blue light, and in some cases, the red or green reflection layer 28 preferably has peak reflectance in the wavelength range of green light and the wavelength range of red light which are described above. In a case where the emission peaks of the red conversion portion 22 and the green conversion portion 23 are broad, spectra of long wavelength light emitted from the respective wavelength conversion portions 22 and 23 are formed to be sharp by strongly reflecting light in the wavelength range of green light and the wavelength range of red light, and thus color purity can be increased. The peak value of the reflectance of the red or green reflection layer 28 is preferably 70% or more.

In the red or green reflection layer 28, it is more preferable that a region corresponding to the micro LED element 100R and a region corresponding to the micro LED element 100G are optically separated. As described above, by configuring the red or green reflection layer 28 to be partitioned for each micro LED element 100, so-called crosstalk in which light leaks to the adjacent sub pixels 7 and 8 with the red or green reflection layer 28 serving as a light guide path can be prevented. For example, in a case where the size of the pixel 5 is 30 μm or more, influence of crosstalk is not large. On the other hand, in the pixel 5 whose size is minutely reduced to a size smaller than 30 μm, blue light is guided to an adjacent sub pixel, and color reproducibility is reduced. More specifically, in a case where the pixel size is made smaller than 10 μm in order to increase the resolution of the display, for example, the distance between pixels is about 1 μm, and the optical path width is such that influence of crosstalk cannot be ignored on the pixel size. Therefore, it is desirable to remove the blue reflection layer 25 in regions between pixels.

Embodiment 3

Embodiment 3 of the present invention will be described below. For easy description, members having the same functions as the members described in Embodiment 2 are denoted by the same reference numerals, and repetitive descriptions thereof will not be made.

An image display device 200b according to Embodiment 3 is different from the image display device 200a of Embodiment 2 only in that an isolation layer a 30 is formed between the red or green reflection layers 28, and other configurations are the same as those of the image display device 200a of Embodiment 2.

Figure 4:
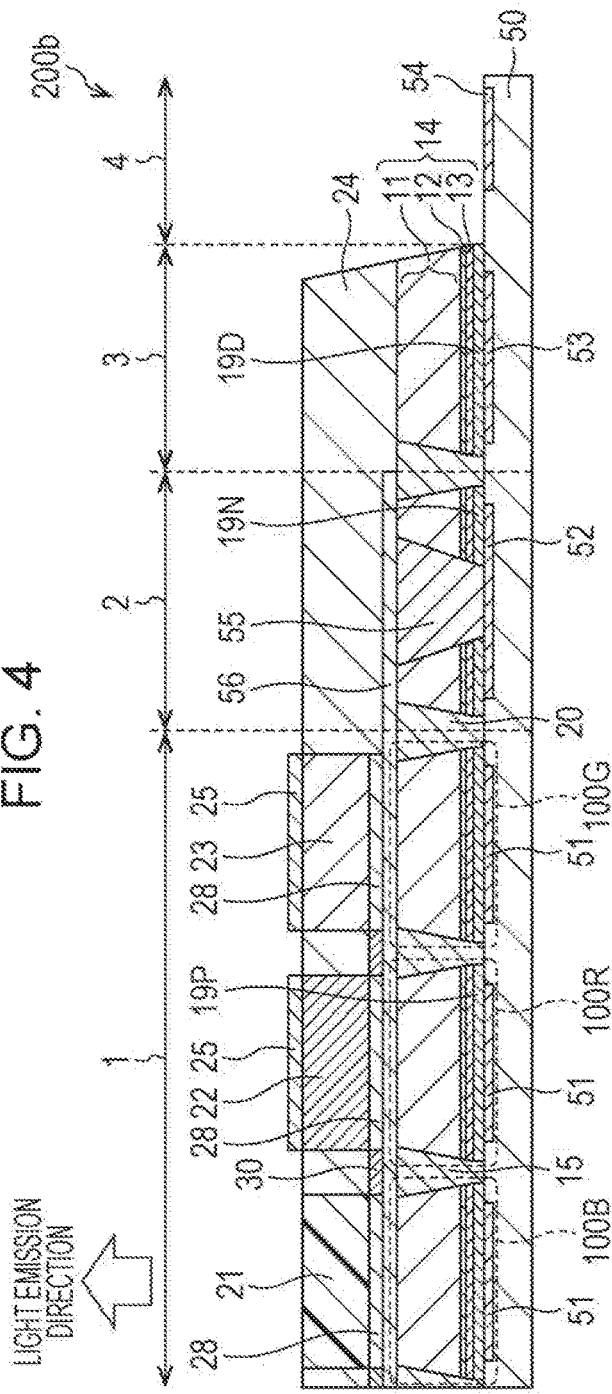
FIG. 4 is a sectional view of an image display device according to Embodiment 3 of the present invention.

FIG. 4 is a sectional view of the image display device 200b according to Embodiment 3. As shown in FIG. 4, the isolation layer a 30 that partitions the red or green reflection layer 28 is formed among the sub pixels 6, 7, and 8. The isolation layer a 30 is made of a light-shielding material (first filling material), and is disposed by filling a gap between the red or green reflection layers 28 partitioned for each micro LED element 100 with a light-shielding material which is a material different from that of the red or green reflection layer 28.

As described above, the isolation layer a 30 made of a light-shielding material partitions the red or green reflection layer 28 for each micro LED element 100, whereby crosstalk in which light leaks to the adjacent sub pixels 6, 7, and 8 can be suppressed. Further, by disposing the isolation layer a 30 between the red or green reflection layers 28, it is possible to ensure planarity of the processed surface when processing the scattering material 21, the red conversion portion 22, and the green conversion portion 23.

For example, in a case where materials of the scattering material 21, the red conversion portion 22, and the green conversion portion 23 are processed by photolithography, if unevenness of the processed surface is large, processing accuracy may be reduced. In the present embodiment, the red or green reflection layer 28 is separated between pixels, and then a gap therebetween is filled with the isolation layer a 30 made of another material. Thus, the outermost surface of the pixel 5 can be planarized.

The material applied to the isolation layer a 30 is not limited, but in a case of an organic material, it is desirable to include a material, such as carbon black, which absorbs light, and the isolation layer a 30 can be formed by photolithography. In a case where the material applied to the isolation layer a 30 is a metal material, the isolation layer a 30 can be formed by a method such as evaporation using titanium or palladium.

Embodiment 4

Embodiment 4 of the present invention will be described below. For easy description, members having the same functions as the members described in Embodiments 1, 2, and 3 are denoted by the same reference numerals, and repetitive descriptions thereof will not be made.

An image display device 200c according to Embodiment 4 is different from the image display device 200b of Embodiment 3 in that the scattering material 21 is not disposed in a portion corresponding to the micro LED element 100B of the blue sub pixel 6, and other configurations are the same as those of the image display device 200b of Embodiment 3.

Figure 5:
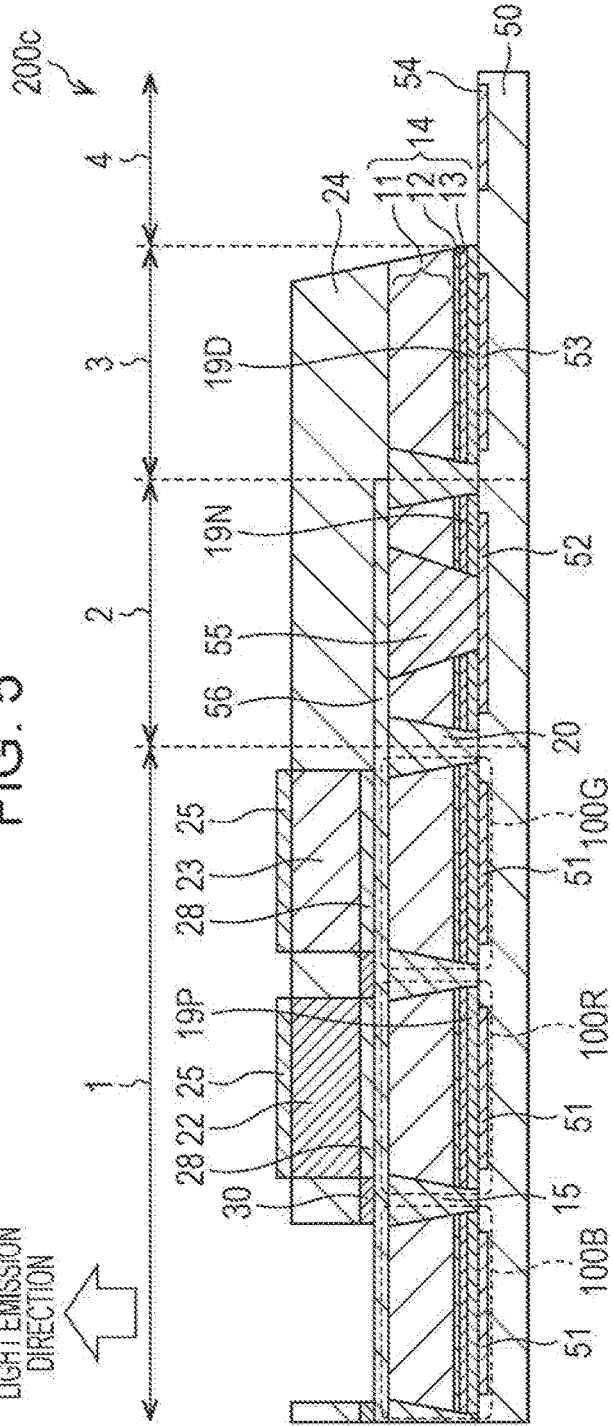
FIG. 5 is a sectional view of an image display device according to Embodiment 4 of the present invention.

FIG. 5 is a sectional view of the image display device 200c according to Embodiment 4. As shown in FIG. 5, the image display device 200c does not include the scattering material 21 on the surface of the micro LED element 100B, whereby in the blue sub pixel 6, directivity of blue light emitted from the micro LED element 100B can be increased. Further, since the scattering material 21 does not have to be disposed in the blue sub pixel 6, man-hours for manufacturing the device can be reduced. Thus, cost reduction can be achieved.

Embodiment 5

Embodiment 5 of the present invention will be described below. For easy description, members having the same functions as the members described in Embodiments 1 to 3 are denoted by the same reference numerals, and repetitive descriptions thereof will not be made.

An image display device 200d according to Embodiment 5 is different from the image display device 200b of Embodiment 3 in that the surfaces of the red or green reflection layer 28 and the blue reflection layer 25 on the light emission side are covered with passivation and that a color filter is formed, and other configurations are the same as those of the image display device 200b of Embodiment 3.

Figure 6:
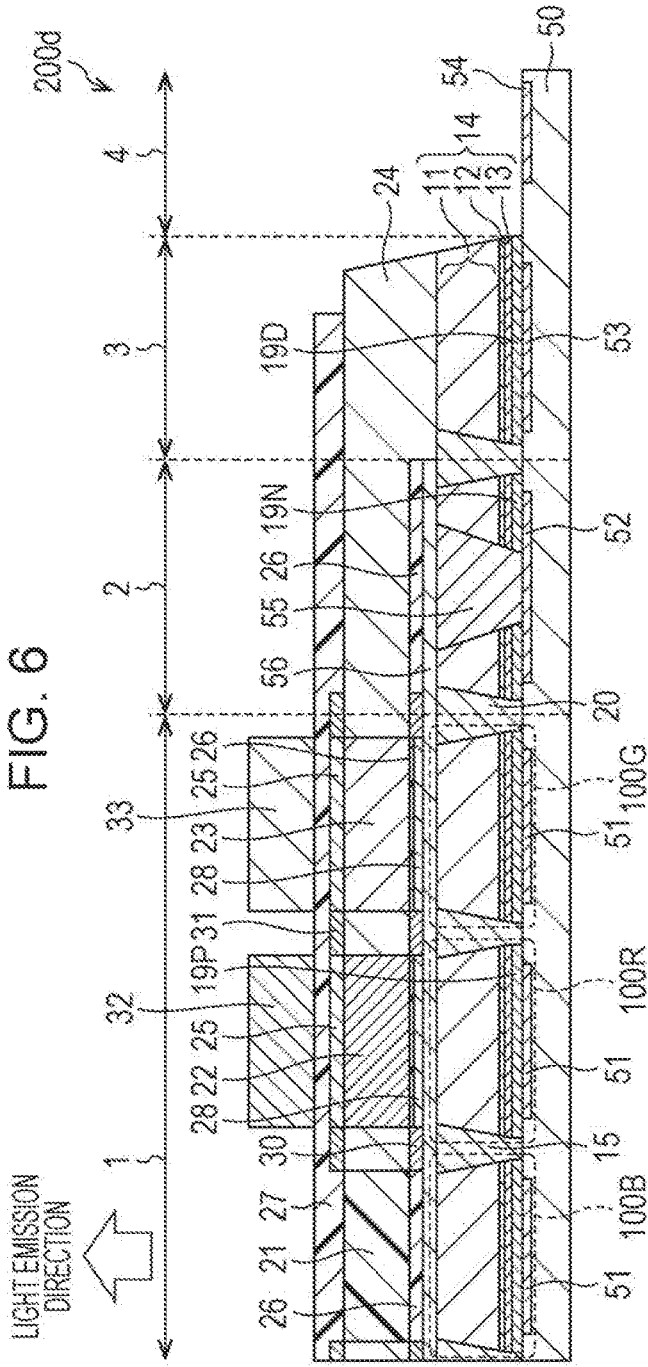
FIG. 6 is a sectional view of an image display device according to Embodiment 5 of the present invention.

FIG. 6 is a sectional view of the image display device 200d according to Embodiment 5. As shown in FIG. 6, in the image display device 200d, the surface of the red or green reflection layer 28 on the light emission side is covered with passivation 26 (second film) having moisture resistance. The surface of the blue reflection layer 25 on the light emission side is covered with passivation 27 (first film) having moisture resistance.

For example, in a case where the red or green reflection layer 28 is a multilayer film formed of a dielectric, the red or green reflection layer 28 generally has high hygroscopicity and easily degrades when exposed to the air or during processing of a color conversion layer. For this reason, it is preferable to cover the entire surface of the red or green reflection layer 28 with a film of the passivation 26. The film of the passivation 26 may be a CVD film such as a silicon nitride film or a film of a resin material such as a silicone resin.

The passivation 26 is desirably formed to be planar, so that workability of the scattering material 21, the red conversion portion 22, and the green conversion portion 23 to be processed later can be improved.

Similarly, even in a case where the blue reflection layer 25 is a multilayer film formed of a dielectric, it is preferable that the entire surface of the blue reflection layer 25 is covered with the passivation 27. The passivation 27 may be a CVD film such as a silicon nitride film or a film of a resin material such as a silicone resin.

As described above, the surface of the red or green reflection layer 28 on the light emission side and the surface of the blue reflection layer 25 on the light emission side are covered with a film having moisture resistance, whereby degradation of a multilayer film formed of a dielectric due to moisture absorption can be prevented.

Further, since the outermost surface is planarized by the passivation 27, a red color filter 32 or a green color filter 33 can be processed more precisely. By additionally processing the color filter in this way, it is possible to more strictly control the wavelength of light emitted from each sub pixel and improve the color gamut of the display.

The passivation 26 and the passivation 27 are desirably formed as thin as possible so that they do not serve as a light guide, and are desirably processed to, for example, 1 µm or less.

An isolation layer b 31 that partitions the blue reflection layer 25 may be formed among the sub pixels 6, 7, and 8. For example, the isolation layer b 31 is made of a light-shielding material (second filling material), and is disposed by filling a gap between the blue reflection layers 25 partitioned for each micro LED element 100 with a light-shielding material which is a material different from that of the blue reflection layer 25.

Embodiment 6

Embodiment 6 of the present invention will be described below. For easy description, members having the same functions as the members described in Embodiments 1 to 5 are denoted by the same reference numerals, and repetitive descriptions thereof will not be made.

An image display device 200e according to Embodiment 6 is different from the image display device 200d of Embodiment 5 in that the configuration of a micro LED element 100h is different and that there is no color filter, and other configurations are the same as those of the image display device 200d of Embodiment 5.

Each of the micro LED elements 100 included in the image display devices described in Embodiments 1 to 5 is a so-called top-bottom electrode type element that includes the P-electrode 19P on the side facing the drive circuit substrate 50 and the common N-electrode 56 on the light emission side opposite to the side facing the drive circuit substrate 50. On the other hand, the image display device 200e according to Embodiment 6 includes the micro LED element 100h having the configuration in which both a P-drive electrode and an N-drive electrode are disposed on one side.

Figure 7:
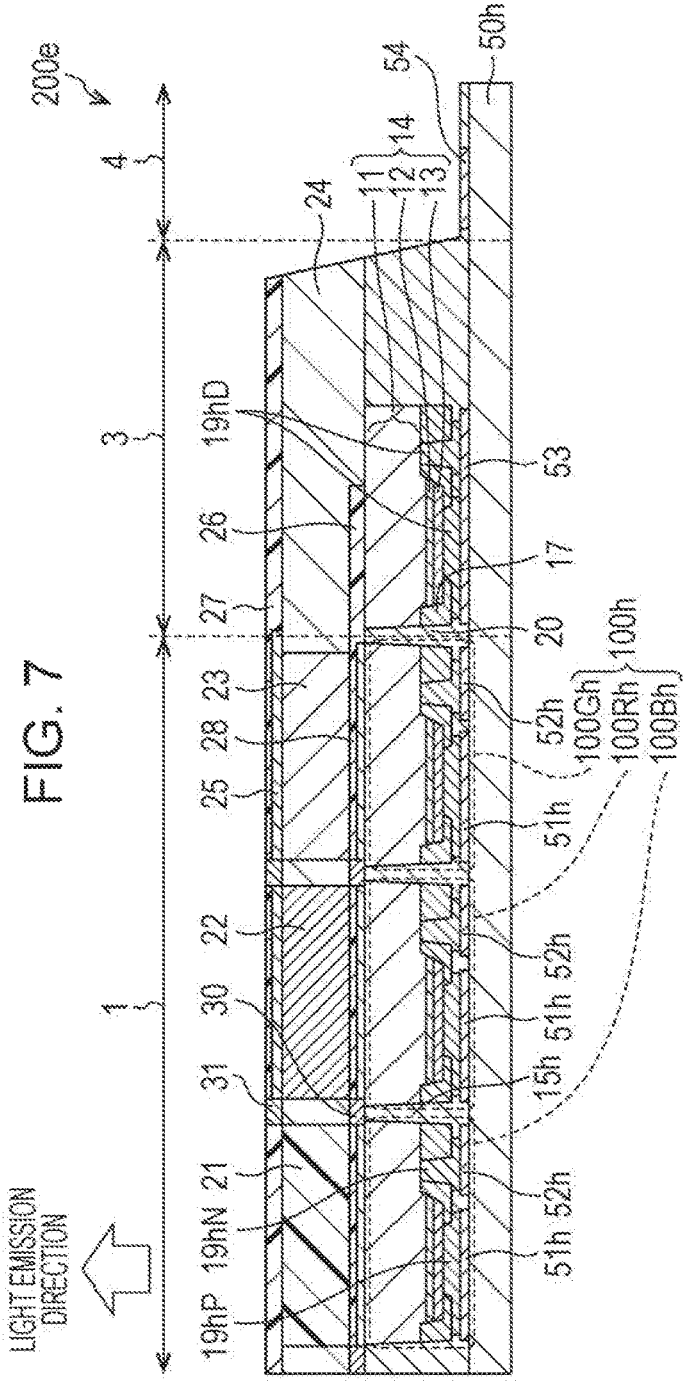
FIG. 7 is a sectional view of an image display device according to Embodiment 6 of the present invention.

FIG. 7 is a sectional view of the image display device 200e according to Embodiment 6. As shown in FIG. 7, the micro LED element 100h has a P-electrode 19hP and an N-electrode 19hN on a drive circuit substrate 50h side. A micro LED element 100Bh that emits light source light of the blue sub pixel 6, a micro LED element 100Rh that emits light source light of the red sub pixel 7, and a micro LED element 100Gh that emits light source light of the green sub pixel 8 are collectively referred to as the micro LED element 100h.

The drive circuit substrate 50h includes a P-drive electrode 51h and an N-drive electrode 52h arranged for each of the sub pixels 6, 7, and 8. The P-drive electrode 51h and the N-drive electrode 52h are connected to the P-electrode 19hP and the N-electrode 19hN, respectively, and allows a predetermined current to flow in each of the micro LED elements 100h to control light emission. As described above, by configuring the micro LED element 100h having the configuration in which both a P-drive electrode and an N-drive electrode are disposed on one side, the manufacturing step of the common N-electrode 56 can be omitted in the manufacturing step of the image display device 200e. Thus, there is an advantage that the image display device 200e can be easily manufactured, and blue light emitted from the light source is not reduced by the common N-electrode 56.

From a viewpoint of the image display device 200e, the effects achieved by the red or green reflection layer 28 and the blue reflection layer 25 are the same as those in Embodiment 2 although the arrangement of the electrodes of the micro LED element 100h is different. That is, by disposing the blue reflection layer 25 on the light emission side of the green conversion portion 23 and the red conversion portion 22, and disposing the red or green reflection layer 28 on the excitation light source side of the green conversion portion 23 and the red conversion portion 22, thicknesses of the green conversion portion 23 and the red conversion portion 22 can be thinned, and light emission efficiency can be improved. With this structure, reduction of the structure of the green conversion portion 23 and the red conversion portion 22 in size can be facilitated, and the amounts of expensive wavelength conversion materials used can be reduced. Thus, the effect of reducing the production cost can be achieved.

While FIG. 7 does not illustrate a color filter as described above, a color filter may be additionally formed to improve color reproducibility.

Embodiment 7

Embodiment 7 of the present invention will be described below. For easy description, members having the same functions as the members described in Embodiments 1 to 6 are denoted by the same reference numerals, and repetitive descriptions thereof will not be made.

An image display device 200f according to Embodiment 7 is different from the image display device 200e of Embodiment 6 only in that the scattering material 21 does not exist on the surface of the micro LED element 100Bh, and other configurations are the same as those of the image display device 200e of Embodiment 6.

Figure 8:
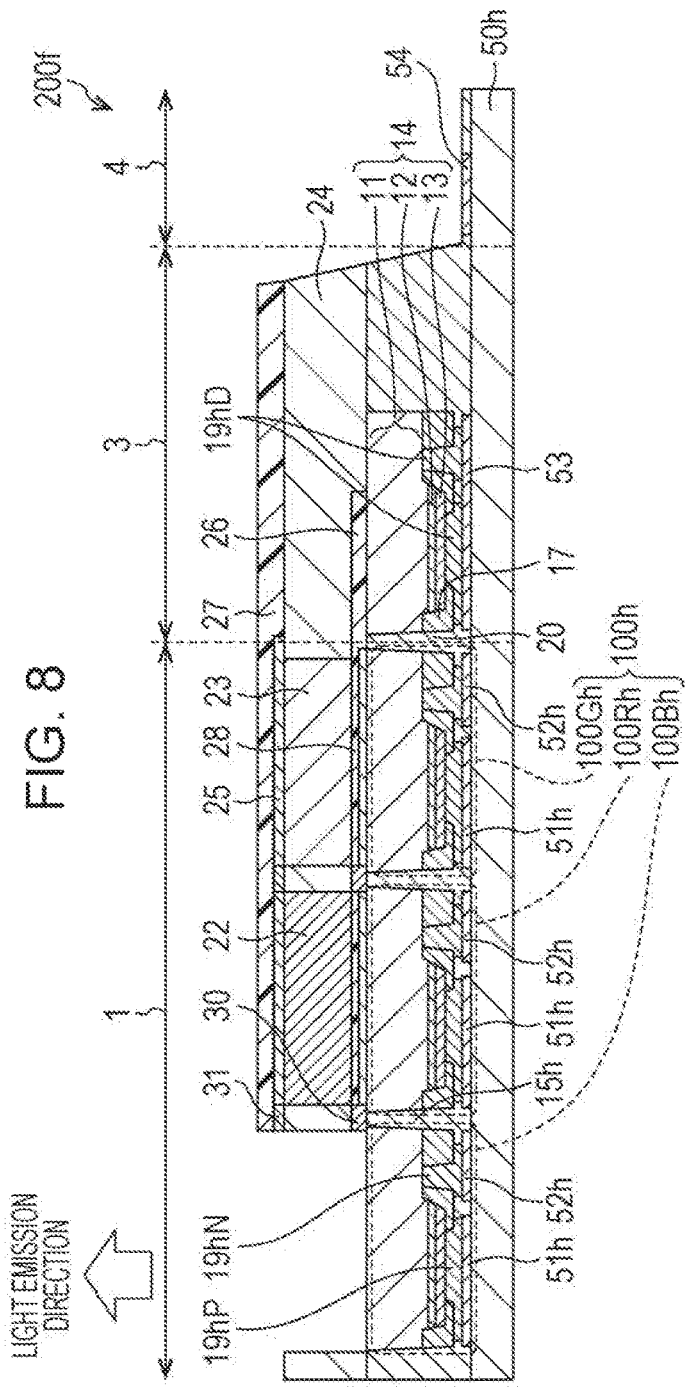
FIG. 8 is a sectional view of an image display device according to Embodiment 7 of the present invention.

FIG. 8 is a sectional view of the image display device 200f according to Embodiment 7. As shown in FIG. 8, the image display device 200f does not include the scattering material 21 on the surface of the micro LED element 100Bh. With this structure, directivity of blue light emitted from the micro LED element 100Bh can be improved, and it is not necessary to form the scattering material 21, so that cost reduction can be achieved by reducing man-hours for manufacturing the device.

Embodiment 8

Embodiment 8 of the present invention will be described below. For easy description, members having the same functions as the members described in Embodiments 1 to 7 are denoted by the same reference numerals, and repetitive descriptions thereof will not be made.

An image display device 200g according to Embodiment 8 is different from the image display device 200e of Embodiment 6 only in that a structure of a part corresponding to a wavelength conversion layer is different, and other configurations are the same as those of the image display device 200e of Embodiment 6.

Figure 9:
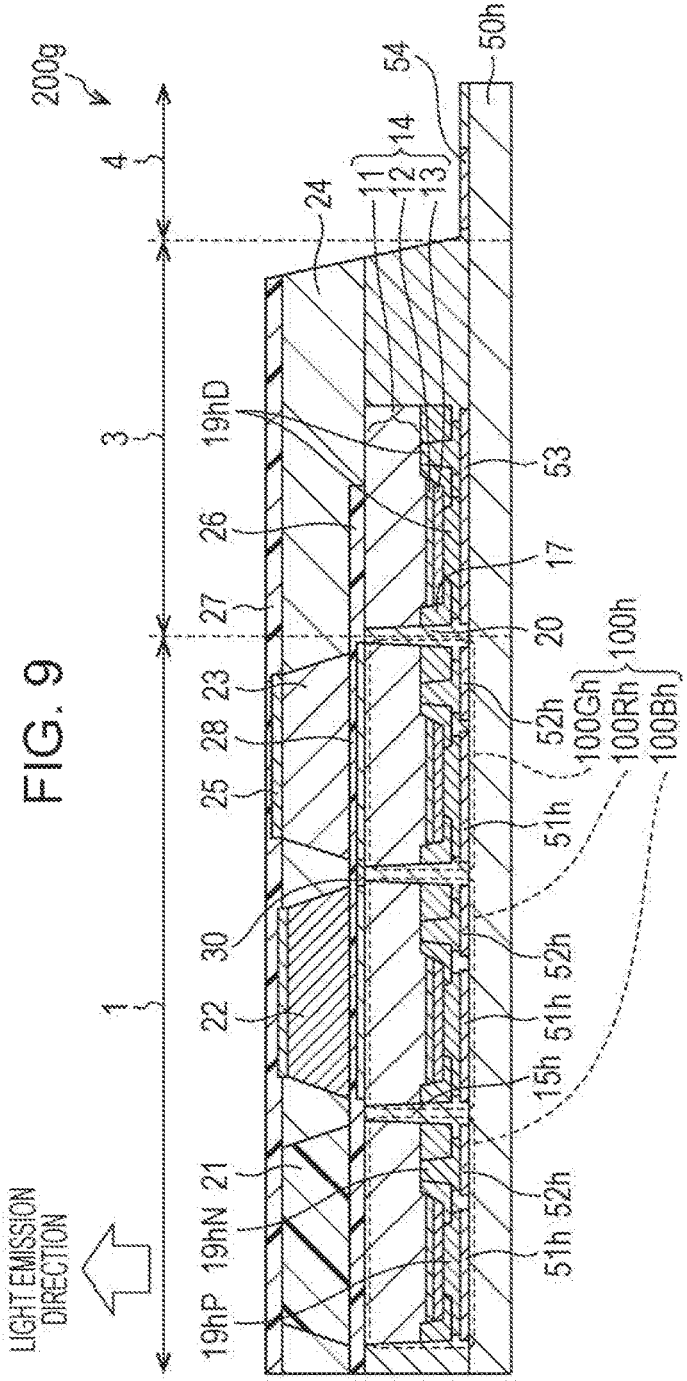
FIG. 9 is a sectional view of an image display device according to Embodiment 8 of the present invention.

FIG. 9 is a sectional view of the image display device 200g according to Embodiment 8. As shown in FIG. 9, in the image display device 200g, thicknesses of the red conversion portion 22 and the green conversion portion 23 which are color conversion materials formed in the light emission direction of the micro LED element 100h are different from each other. Further, unlike Embodiments 1 to 7, the red conversion portion 22 and the green conversion portion 23 have a forward tapered shape.

FIG. 9 illustrates an example in which a thickness of the green conversion portion 23 is thicker than a thickness of the red conversion portion 22. The image display device 200g is not limited to this, and may have a configuration in which a thickness of the red conversion portion 22 is thicker than a thickness of the green conversion portion 23.

Photolithography is used as one of methods for minutely processing color conversion layers such as the red conversion portion 22 and the green conversion portion 23. In a case where the red conversion portion 22 and the green conversion portion 23 are formed using photolithography, difference occurs in a thickness of each color conversion layer due to a processing material or a processing order, and a shape tends to be a forward tapered shape. On the other hand, the color gamut of emitted light can be controlled by color conversion efficiency of each material and thicknesses of the formed color conversion layers, and specifications required for a display screen can be satisfied.

In a case where thicknesses of the red conversion portion 22 and the green conversion portion 23 are different from each other, it is desirable that the blue reflection layer 25 is formed for each color conversion layer. In a case where the blue reflection layer 25 is formed for each color conversion layer, the blue reflection layer 25 is formed by being divided for each of the sub pixels 6, 7, and 8. Therefore, it is possible to prevent light leakage among the adjacent sub pixels 6, 7, and 8 via the blue reflection layer 25.

As described above, by configuring the red conversion portion 22 and the green conversion portion 23 which are wavelength conversion layers to be partitioned for each micro LED element 100h and to have different thicknesses from each other, the color gamut of light emitted from each of the sub pixels 6, 7, and 8 can be appropriately controlled, and crosstalk among the adjacent sub pixels 6, 7, and 8 can be prevented.

Embodiment 9

Embodiment 9 of the present invention will be described below. For easy description, members having the same functions as the members described in Embodiments 1 to 8 are denoted by the same reference numerals, and repetitive descriptions thereof will not be made.

An image display device 200h according to Embodiment 9 is different from the image display device 200g of Embodiment 8 in a structure of a part corresponding to a red or green reflection layer which is a second functional layer, and other configurations are basically the same as those of the image display device 200g of Embodiment 8.

Figure 10:
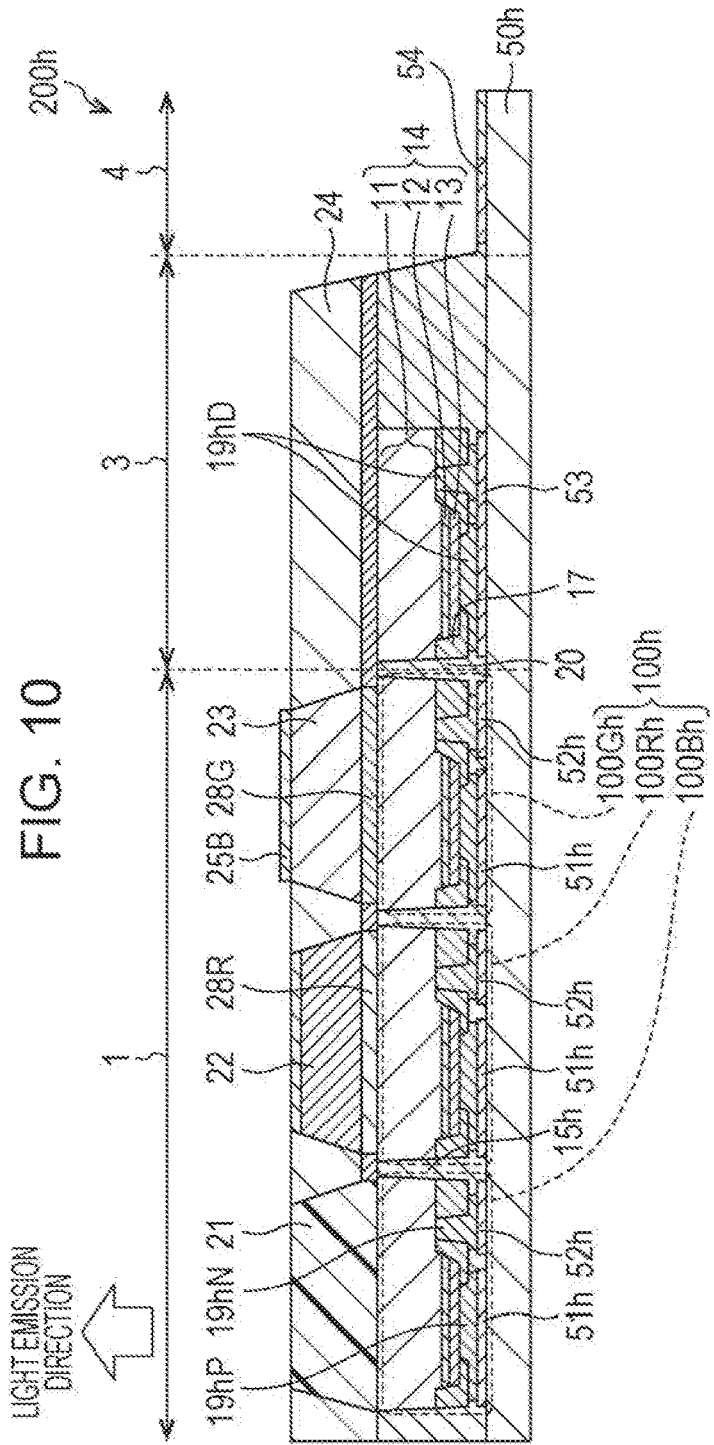
FIG. 10 is a sectional view of an image display device according to Embodiment 9 of the present invention.

FIG. 10 is a sectional view of the image display device 200h according to Embodiment 9. As shown in FIG. 10, in the image display device 200h, a red reflection layer 28R is disposed on the micro LED element 100Rh and a green reflection layer 28G is disposed on the micro LED element 100Gh among a plurality of micro LED elements 100h. As described above, in the image display device 200h, a film that reflects wavelength-converted light formed on the light emission side of each micro LED element 100h corresponds to the wavelength of light emitted from a wavelength conversion layer.

As described above, by changing a reflection layer formed for each of the sub pixels 6, 7, and 8 and reflecting light after wavelength-converted light according to the wavelength, design of a reflection layer can be further simplified, and the reflectance of light converted to have long wavelength by a wavelength conversion layer can be further increased. Further, this configuration achieves the effect of suppressing crosstalk among adjacent sub pixels by dividing into the sub pixels 6, 7, and 8.

Embodiment 10

Embodiment 10 of the present invention will be described below. For easy description, members having the same functions as the members described in Embodiments 1 to 9 are denoted by the same reference numerals, and repetitive descriptions thereof will not be made.

An image display device 200i according to Embodiment 10 is different from the image display device 200h of Embodiment 9 in a micro LED element which is a light source of excitation light and structures corresponding to a first functional layer, a second functional layer, and a color conversion layer. Other configurations of the image display device 200i are the same as those of the image display device 200h of Embodiment 9.

Figure 11:
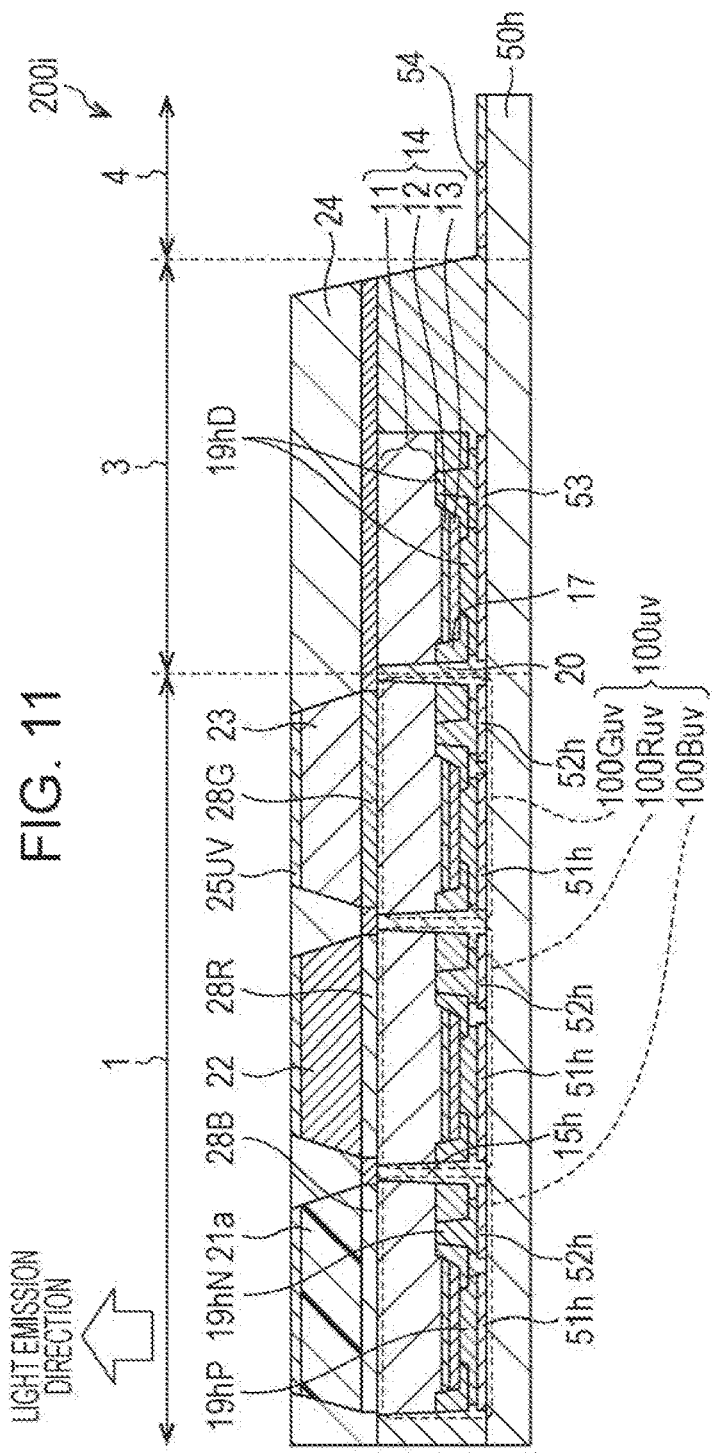
FIG. 11 is a sectional view of an image display device according to Embodiment 10 of the present invention.

FIG. 11 is a sectional view of the image display device 200i according to Embodiment 10. As shown in FIG. 11, a micro LED element 100uv mainly emits light in an ultraviolet region as light source light. The image display device 200i includes, as a color conversion member, a blue conversion portion 21a, the red conversion portion 22, and the green conversion portion 23 that emit blue, red, and green fluorescent light using light from the micro LED element 100uv as excitation light. A micro LED element 100Buv corresponding to the blue sub pixel 6, a micro LED element 100Ruv corresponding to the red sub pixel 7, and the micro LED element 100Guv corresponding to the green sub pixel 8 are collectively referred to as the micro LED element 100uv. The blue conversion portion 21a, the red conversion portion 22, and the green conversion portion 23 are formed on the light emission side of each of the micro LED element 100Buv, the micro LED element 100Ruv, and the micro LED element 100Guv, respectively.

Between the micro LED element 100*uv* and each of the blue conversion portion 21*a*, the red conversion portion 22, and the green conversion portion 23, a blue reflection layer 28B, the red reflection layer 28R, and the green reflection layer 28G are formed as functional layers that transmit light in an ultraviolet region and have high reflectance of blue, red, and green light, respectively. The blue reflection layer 28B, the red reflection layer 28R, and the green reflection layer 28G are divided by the isolation layer a 30 made of, for example, a resin. While illustration is not provided, these reflection layers may be covered with a film having moisture resistance (for example, a passivation film).

An ultraviolet reflection layer 25UV that reflects light in an ultraviolet region and transmits light in a visible light region is formed on the light side of each of the blue conversion portion 21*a*, the red conversion portion 22, and the green conversion portion 23. The ultraviolet reflection layer 25UV is divided for each of the sub pixels 6, 7, and 8. As described above, by configuring the ultraviolet reflection layer 25UV to be divided for each of the sub pixels 6, 7, and 8, crosstalk among the sub pixels 6, 7, and 8 can be reduced.

In FIG. 11, while the blue reflection layer 28B, the red reflection layer 28R, and the green reflection layer 28G as second functional layers, and the blue conversion portion 21*a*, the red conversion portion 22, and the green conversion portion 23 as wavelength conversion layers have the same height, respectively, each height may be different. Each of the sub pixels 6, 7, and 8 may have a configuration in which passivation for protecting the ultraviolet reflection layer 25UV and a color filter for more strictly controlling the wavelength emitted from each sub pixel are provided on the outermost surface on the light emission side.

Embodiment 11

Embodiment 11 of the present invention will be described below. For easy description, members having the same functions as the members described in Embodiments 1 to 10 are denoted by the same reference numerals, and repetitive descriptions thereof will not be made.

A configuration of an image display device 200*j* according to Embodiment 11 is different from that of the image display device 200*e* of Embodiment 6 in that none of the green conversion portion 23, the red conversion portion 22, and the scattering material 21 is provided, a yellow reflection layer 40 and a yellow wavelength conversion portion 60 are provided over the entire pixel 5, and the sub pixels 6, 7, and 8 have color filters of blue, green, and red, respectively. Other configurations are the same as those of the image display device 200*e* of Embodiment 6.

FIG. 12 is a sectional view of the image display device 200*j* according to Embodiment 11. As shown in FIG. 12, in the image display device 200*j*, the yellow wavelength conversion portion 60 is formed over the entire pixel region 1. The yellow wavelength conversion portion 60 is a member that is excited by blue light, emits yellow light, and emits white light as a whole. A blue color filter 31, a red color filter 32, and a green color filter 33 are arranged on the blue sub pixel 6, the red sub pixel 7, and the green sub pixel 8, respectively, and the blue sub pixel 6, the red sub pixel 7, and the green sub pixel 8 emit blue light, red light, and green light, respectively.

In the yellow wavelength conversion portion 60, for example, YAG phosphor minute particles can be used. The YAG phosphor is a phosphor that has higher stability than quantum dots and can be used even at a relatively high temperature. Accordingly, the image display device 200*j* can be operated with higher power than devices in which quantum dots or other phosphor materials different from the YAG phosphor are used, and has a configuration useful in a case where high light output is desired.

As described above, since only the yellow wavelength conversion portion 60 is formed as a wavelength conversion layer in the image display device 200*j*, the manufacturing step is very simple. In addition, the wavelength conversion layer does not have to be processed for each of the sub pixels 6, 7, and 8, and a color filter technology that is generally used can be used. Thus, the manufacturing step is technically easy. Therefore, according to the present embodiment, in the image display device 200*j*, light output can be improved while an increase in cost is reduced to the minimum.

Modification Example of Embodiment 11

FIG. 13 is a sectional view of a modification example of the image display device 200*j* according to Embodiment 11. As shown in FIG. 13, an image display device 200 *k* may have a configuration in which the scattering material 21 is disposed in a part corresponding to the blue sub pixel 6 instead of the yellow reflection layer 40 and the yellow wavelength conversion portion 60. In this case, the blue color filter 31 is not formed in the blue sub pixel 6.

The present invention is not limited to each embodiment described above, and various changes can be made within the scope disclosed in the claims. Embodiments that are acquired by appropriately combining each technical means disclosed in different embodiments also fall within the technical scope of the present invention. Furthermore, new technical features can be formed by combining each technical means disclosed in each embodiment.

What is claimed is:

1. An image display device comprising:
a plurality of LED elements that are mounted on a drive circuit substrate and emit light source light;
a wavelength conversion layer that is stacked on a side of the LED elements opposite to the drive circuit substrate, converts the light source light emitted by the LED elements into long wavelength light, and emits the long wavelength light to a side opposite to the drive circuit substrate; and
a first functional layer that is disposed on a light emitting surface side of the long wavelength light of the wavelength conversion layer, reflects the light source light, and transmits the long wavelength light,
wherein the drive circuit substrate supplies a prescribed current to the LED elements to control emission of light by the LED elements, and
the first functional layer has a higher reflectance in a wavelength region of the light source light than in a wavelength region of the long wavelength light.

2. The image display device according to claim 1, wherein a light emitting surface of the first functional layer is covered with a first film having moisture resistance.

3. The image display device according to claim 1, wherein the wavelength conversion layer is partitioned for each of the plurality of LED elements.

4. The image display device according to claim 1, wherein the first functional layer is made of a dielectric.

5. The image display device according to claim 1,
wherein the first functional layer comprises a plurality of first functional layers each provided for a different one of the plurality of LED elements, and the first functional layers are separated from each other.

6. The image display device according to claim 5,
wherein a gap between the first functional layers partitioned for each of the plurality of LED elements is filled with a first filling material different from a material of the first functional layer.

7. The image display device according to claim 1, further comprising
a second functional layer that is disposed on a light incident surface side of the light source light of the wavelength conversion layer and reflects the long wavelength light, the second functional layer having a higher reflectance in a wavelength region of the long wavelength light than in a wavelength region of the light source light.

8. The image display device according to claim 7,
wherein a light emitting surface of the second functional layer is covered with a second film having moisture resistance.

9. The image display device according to claim 7,
wherein the second functional layer is made of a dielectric.

10. The image display device according to claim 7,
wherein the second functional layer comprises a plurality of second functional layers each provided for a different one of the plurality of LED elements, and the second functional layers are separated from each other.

11. The image display device according to claim 10,
wherein a gap between the second functional layers partitioned for each of the plurality of LED elements is filled with a second filling material different from a material of the second functional layer.

* * * * *